(12) United States Patent
Ha et al.

(10) Patent No.: US 9,677,172 B2
(45) Date of Patent: Jun. 13, 2017

(54) METHODS FOR FORMING A COBALT-RUTHENIUM LINER LAYER FOR INTERCONNECT STRUCTURES

(71) Applicant: APPLIED MATERIALS, INC., Santa Clara, CA (US)

(72) Inventors: Tae Hong Ha, San Jose, CA (US); Wei Lei, San Jose, CA (US); Kie Jin Park, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/601,685

(22) Filed: Jan. 21, 2015

(65) Prior Publication Data
US 2015/0203961 A1    Jul. 23, 2015

Related U.S. Application Data

(60) Provisional application No. 61/929,965, filed on Jan. 21, 2014.

(51) Int. Cl.
| | |
|---|---|
| *C23C 16/04* | (2006.01) |
| *C23C 16/56* | (2006.01) |
| *C23C 28/02* | (2006.01) |
| *C23C 16/16* | (2006.01) |
| *C23C 16/02* | (2006.01) |
| *C23C 16/455* | (2006.01) |

(52) U.S. Cl.
CPC ........ *C23C 16/045* (2013.01); *C23C 16/0281* (2013.01); *C23C 16/16* (2013.01); *C23C 16/45523* (2013.01); *C23C 16/56* (2013.01); *C23C 28/021* (2013.01); *C23C 28/023* (2013.01)

(58) Field of Classification Search
CPC ... H01L 35/16; H01L 33/22; H01L 31/02363; H01L 31/022458; H01L 31/022425; H01L 29/66068; H01L 21/02562; H01L 21/02068; H01L 21/3065; H01L 21/30604; C23C 28/023; C23C 16/56; C23C 28/021; C23C 16/045; C23C 16/16
USPC .............. 438/681, 686, 758, 778; 257/E21.1
See application file for complete search history.

(56) References Cited

U.S. PATENT DOCUMENTS

| | | | |
|---|---|---|---|
| 2006/0223300 A1* | 10/2006 | Simka ..................... | C23C 16/18 438/618 |
| 2012/0141667 A1* | 6/2012 | Kim ....................... | C23C 14/046 427/123 |
| 2012/0161320 A1* | 6/2012 | Akolkar ............. | H01L 21/76883 257/751 |
| 2012/0252207 A1* | 10/2012 | Lei .................... | H01L 21/76885 438/653 |

* cited by examiner

*Primary Examiner* — Thomas L Dickey
*Assistant Examiner* — Changhyun Yi
(74) *Attorney, Agent, or Firm* — Moser Taboada; Alan Taboada

(57) ABSTRACT

Methods for forming a liner layer are provided herein. In some embodiments, a method of forming a liner layer on a substrate disposed in a process chamber, the substrate having an opening formed in a first surface of the substrate, the opening having a sidewall and a bottom surface, the method includes exposing the substrate to a cobalt precursor gas and to a ruthenium precursor gas to form a cobalt-ruthenium liner layer on the first surface of the substrate and on the sidewall and bottom surface of the opening.

11 Claims, 5 Drawing Sheets

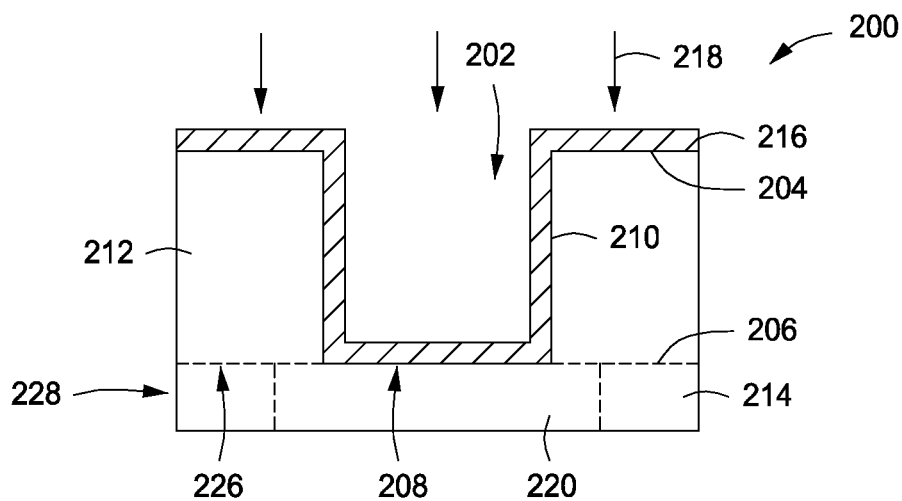
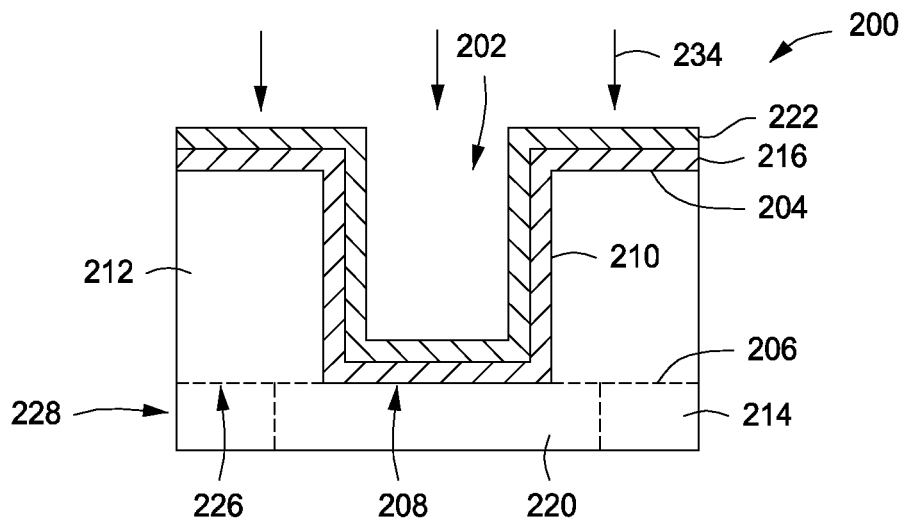
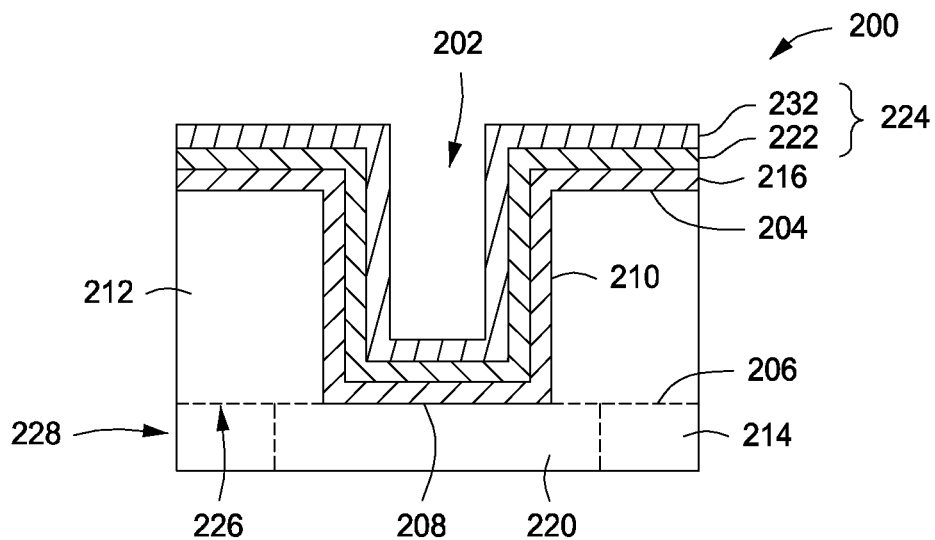

METHODS FOR FORMING A COBALT-RUTHENIUM LINER LAYER FOR INTERCONNECT STRUCTURES

CROSS-REFERENCE TO RELATED APPLICATIONS

This application claims benefit of U.S. provisional patent application Ser. No. 61/929,965, filed Jan. 21, 2014, which is herein incorporated by reference in its entirety.

FIELD

Embodiments of the present disclosure generally relate to methods of processing substrates, and specifically to methods for forming a cobalt-ruthenium liner layer for copper interconnect structures.

BACKGROUND

The inventors believe that cobalt, deposited for example by chemical vapor deposition (CVD) is attractive as a liner material for copper interconnects because cobalt provides good step coverage and is used to achieve low line and via resistance. However, the inventors have observed that, as device nodes get smaller (for example, approaching dimensions of about 22 nm or less), gap-filling processes become challenging for such cobalt liners.

The inventors further believe that ruthenium, deposited for example by chemical vapor deposition (CVD), is also a promising candidate as a liner material for copper interconnects because ruthenium advantageously improves a copper reflow process, frequently used to form a copper interconnect. A ruthenium liner also provides improved resistance to electroplating chemistry than cobalt. However, the inventors have observed that a ruthenium liner undesirably creates device performance issues, such as poor electron migration and time dependent dielectric breakdown.

Thus, the inventors have provided improved methods for forming liner layers for copper interconnect structures.

SUMMARY

Methods for forming a cobalt-ruthenium layer are provided herein. In some embodiments, a method of forming a cobalt-ruthenium layer on a substrate disposed in a process chamber, the substrate having an opening formed in a first surface of the substrate, the opening having a sidewall and a bottom surface, the method includes exposing the substrate to a cobalt precursor gas and to a ruthenium precursor gas to form a cobalt-ruthenium layer on the first surface of the substrate and on the sidewall and bottom surface of the opening.

In some embodiments, a method of forming a cobalt-ruthenium layer on a substrate disposed in a process chamber includes: exposing a substrate having an opening formed in a first surface of the substrate to a cobalt precursor and to a ruthenium precursor to form a cobalt-ruthenium layer on the first surface of the substrate and on a sidewall and a bottom surface of the opening, wherein the substrate is either simultaneously exposed to the ruthenium precursor and to the cobalt precursor or is sequentially exposed to the cobalt precursor for a first period of time to form a cobalt layer on the first surface of the substrate and on the sidewall and bottom surface of the opening and exposed to the ruthenium precursor for a second period of time, subsequent to the first period of time, to form a ruthenium layer atop the cobalt layer; depositing a conductive layer atop the cobalt-ruthenium layer; and annealing the substrate to fill the opening by drawing the conductive layer toward the bottom of the opening.

In some embodiments, a computer readable medium is provided having instructions stored thereon that, when executed, causes a process chamber to perform a method of forming a cobalt-ruthenium layer on a substrate disposed in a process chamber. The method may include any of the methods disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate typical embodiments of the disclosure and are therefore not to be considered limiting of scope, for the disclosure may admit to other equally effective embodiments.

FIGS. 2A-2E depict side cross-sectional views of an interconnect structure formed in a substrate in accordance with some embodiments of the present disclosure.

Figure 1:
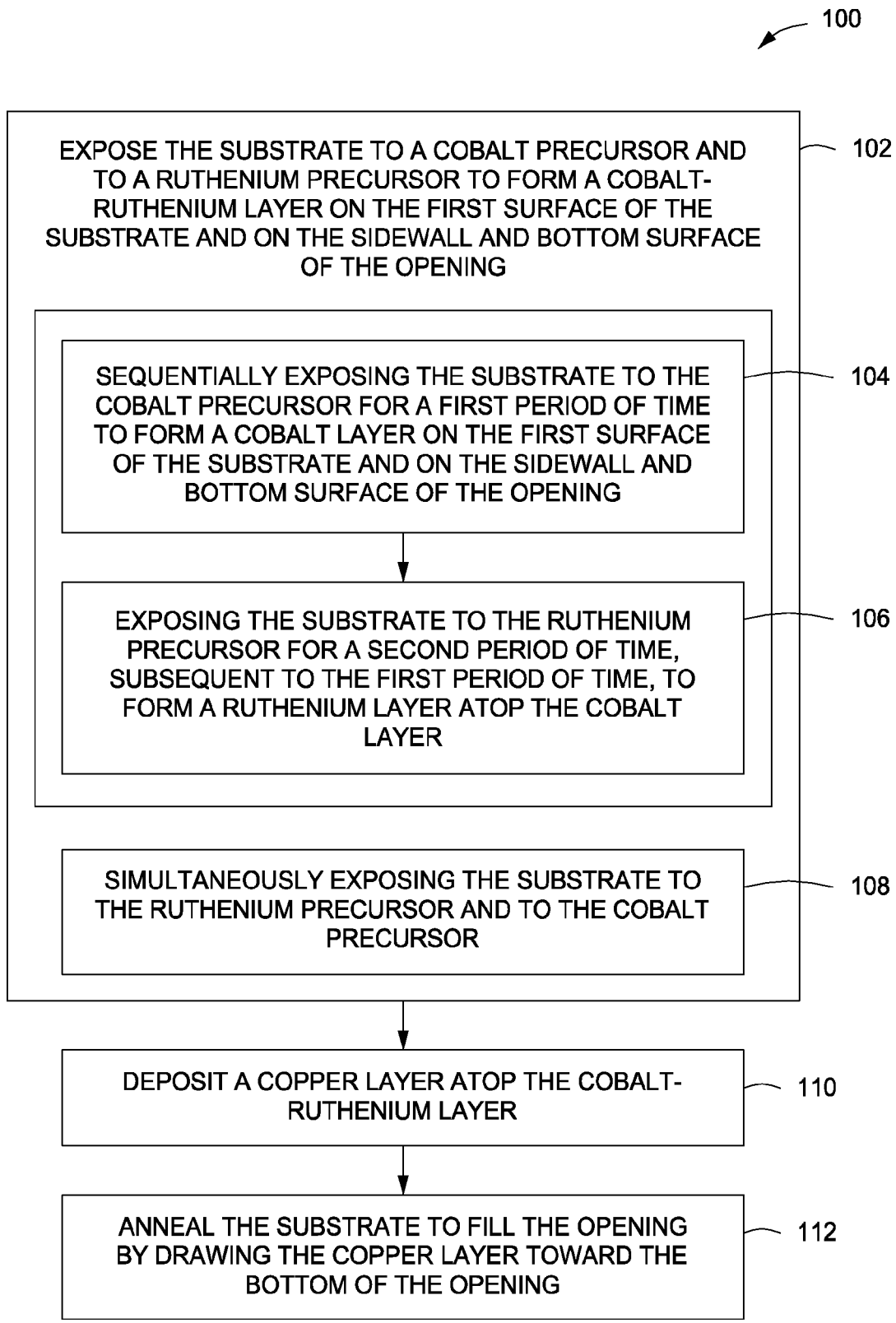
FIG. 1 depicts a flow chart of a method for forming an interconnect structure in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for forming a cobalt-ruthenium liner layer for copper interconnect structures are provided herein. A "liner layer," as used herein, may refer to a layer conformably formed along at least a portion of the sidewalls and/or lower surface of an opening such that a substantial portion of the opening prior to the deposition of the layer remains unfilled after deposition of the layer. In some embodiments, the liner layer may be formed along the entirety of the sidewalls and lower surface of the opening. The cobalt-ruthenium liner layer described herein advantageously facilitates improved copper interconnect structures through one or more of improved copper reflow and improved device properties such as electron migration and time dependent dielectric breakdown. The inventive methods may be utilized with any device nodes, but may be particularly advantageous in device nodes of about 25 nm or less, for example about 20 nm to about 25 nm. Further, the inventive methods may be particularly advantageous with interconnect structures formed by re-flowing copper (Cu) to fill an opening.

FIG. 1 depicts a flow chart of a method 100 for forming a cobalt-ruthenium layer in accordance with some embodiments of the present disclosure. The method 100 is described below with respect to an interconnect structure, as depicted in FIGS. 2A-2E and FIGS. 3A-3B. The method 100 may be performed in any suitable process chambers configured for one or more of chemical vapor deposition (CVD), physical vapor deposition (PVD), or atomic layer deposition (ALD). Exemplary processing systems that may be used to perform the inventive methods disclosed herein may include, but are not limited to, any of the ENDURA®, CENTURA®, or PRODUCER® line of processing systems, and the ALPS® Plus or SIP ENCORE® PVD process chambers, all commercially available from Applied Materials, Inc., of Santa Clara, Calif. Other process chambers, including ones available from other manufacturers, may also be suitably used in connection with the teachings provided herein.

Figure 2D:
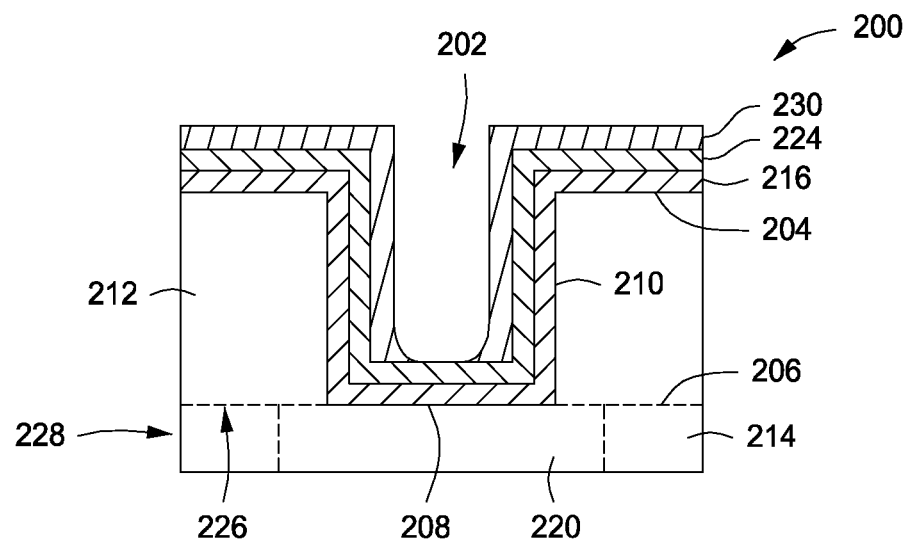
Figure 3A:
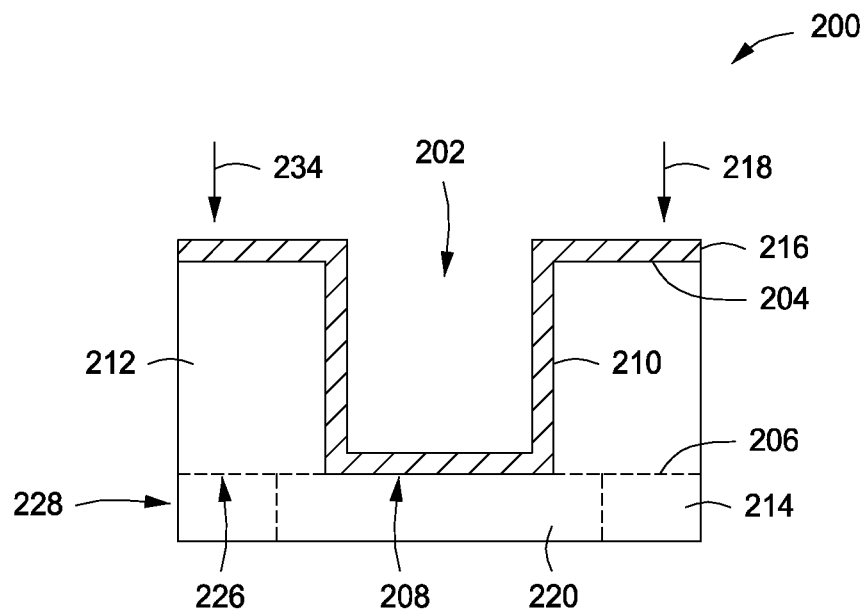
FIGS. 3A-3B depict side cross-sectional views of an interconnect structure formed in a substrate in accordance with some embodiments of the present disclosure.

FIG. 2A and FIG. 3A depict a substrate 200 having an opening 202 formed in a first surface 204 of the substrate 200 and extending into the substrate 200 towards an opposing second surface 206 of the substrate 200. The substrate 200 may be any suitable substrate having an opening 202 formed in the substrate. For example, the substrate 200 may comprise one or more of a dielectric material, silicon (Si), metals, or the like. In addition, the substrate 200 may include additional layers of materials or may have one or more completed or partially completed structures formed in, or on, the substrate 200. For example, the substrate 200 may include a first dielectric layer 212, such as silicon oxide, a low-k material (e.g., a material having a dielectric constant less than silicon oxide, or less than about 3.9), or the like. The opening 202 may be formed in the first dielectric layer 212. In some embodiments, the first dielectric layer 212 may be disposed atop a second dielectric layer 214, such as silicon oxide, silicon nitride, silicon carbide, or the like. A conductive material (e.g., conductive material 220) may be disposed in the second dielectric layer 214 and may be aligned with the opening 202 such that the opening, when filled with a conductive material, provides an electrical path to and from the conductive material. For example, the conductive material may be part of a line or via to which the interconnect is coupled.

The opening 202 may be any opening, such as a via, trench, dual damascene structure, or the like. In some embodiments, the opening 202 may have a height to width aspect ratio of about 4:1 or more (e.g., a high aspect ratio). The opening 202 may be formed by etching the substrate 200 using any suitable etch process. The opening 202 includes a bottom surface 208 and sidewalls 210.

In some embodiments, the substrate 200 may be covered with one or more layers prior to depositing the cobalt-ruthenium layer as described below. For example, the sidewalls 210 of the opening 202, the bottom surface 208 of the opening, and the first surface 204 of the substrate 200 may be covered by a barrier layer 216. The barrier layer 216 may serve to prevent diffusion of a subsequently deposited metal layer into underlying layers, such as first dielectric layer 212. The barrier layer 216 may comprise any material suitable to act as a barrier. For example, in some embodiments, the barrier layer 216 may comprise a metal, for example, titanium (Ti), tantalum (Ta), cobalt (Co), manganese (Mn), tungsten (W), hafnium (Hf), alloys thereof, or the like, or in some embodiments, a metal nitride, such as titanium nitride (TiN), tantalum nitride (TaN), tungsten nitride (WN), or the like. The barrier layer 216 may have any thickness suitable to prevent the diffusion of subsequently deposited metal layer materials into underlying layers. For example, in some embodiments, the barrier layer 216 layer may have a thickness of about 10 to about 50 angstroms. The barrier layer 216 may be formed by any process suitable to provide the barrier layer 216 having a suitable thickness. For example, in some embodiments, the barrier layer 216 may be formed via a deposition process, such as chemical vapor deposition, physical vapor deposition, or a cyclical deposition process, for example, such as atomic layer deposition, or the like.

In some embodiments, and as illustrated by dotted lines in FIGS. 2A and 3A, the opening 202 may extend completely through the substrate 200 and an upper surface 226 of a second substrate 228 and may form the bottom surface 208 of the opening 202. The second substrate 228 may be disposed adjacent to the second surface 206 of the substrate 200. Further (and also illustrated by dotted lines), a conductive material (e.g., conductive material 220), for example as part of a device, such as a logic device or the like, or an electrical path to a device requiring electrical connectivity, such as a gate, a contact pad, a conductive line or via, or the like, may be disposed in the upper surface 226 of the second substrate 228 and aligned with the opening 202. In some embodiments, the conductive material (e.g., 220) aligned with the opening 202 may comprise copper.

The method 100 generally begins at 102, where the substrate 200 is exposed to a cobalt precursor 218 and to a ruthenium precursor 234 to form a cobalt-ruthenium layer 224 on the first surface 204 of the substrate 200 and on the sidewalls 210 and the bottom surface 208 of the opening 202. In some embodiments, the substrate 200 may be heated prior to depositing the cobalt-ruthenium layer 224.

In some embodiments, the substrate 200 is exposed to the cobalt precursor 218 at a flow rate of about 750 sccm to about 1000 sccm. In some embodiments, suitable cobalt precursors may include one or more of cobalt carbonyl complexes, cobalt amidinate compounds, cobaltocene compounds, cobalt dienyl complexes, cobalt nitrosyl complexes, derivatives thereof, complexes thereof, plasmas thereof, or combinations thereof. In some embodiments, dicobalt hexacarbonyl acetyl compounds may be used to form cobalt layer 222. Dicobalt hexacarbonyl acetyl compounds may have the chemical formula of $(CO)_6CO_2(RC\equiv CR')$, wherein R and R' are independently selected from hydrogen, methyl, ethyl, propyl, isopropyl, butyl, tertbutyl, penta, benzyl, aryl, isomers thereof, derivatives thereof, or combinations thereof. In one example, dicobalt hexacarbonyl butylacetylene (CCTBA, $(CO)_6CO_2(HC\equiv C^tBu)$) is the cobalt precursor. Other examples of dicobalt hexacarbonyl acetyl compounds include dicobalt hexacarbonyl methylbutylacetylene ($(CO)_6CO_2(MeC\equiv C^tBu)$), dicobalt hexacarbonyl phenylacetylene ($(CO)_6CO_2(HC\equiv CPh)$), hexacarbonyl methylphenylacetylene ($(CO)_6CO_2(MeC\equiv CPh)$), dicobalt hexacarbonyl methylacetylene ($(CO)_6CO_2(HC\equiv CMe)$), dicobalt hexacarbonyl dimethylacetylene ($(CO)_6CO_2(MeC\equiv CMe)$), derivatives thereof, complexes thereof, or combinations thereof. Other exemplary cobalt carbonyl complexes include cyclopentadienyl cobalt bis(carbonyl) ($CpCo(CO)_2$), tricarbonyl allyl cobalt ($(CO)_3Co(CH_2CH\equiv CH_2)$), or derivatives thereof, complexes thereof, or combinations thereof.

In some embodiments, the substrate is exposed to the ruthenium precursor at a flow rate of about 500 sccm to about 1050 sccm. In some embodiments, suitable ruthenium precursors may include one or more of methyl-cyclohexadine ruthenium tricarbonylcyclohexadine, ruthenium tricarbonyl, butadiene ruthenium tricarbonyl, dimethyl butadiene ruthenium tricarbonyl, or modified dines with $Ru(CO)_3$.

In some embodiments, the method may further comprise flowing a reactant gas, such as hydrogen ($H_2$), along with the precursor gases. General processing conditions for forming the cobalt-ruthenium layer 224 discussed above include maintaining process chamber pressure at about 15 to about 25 Torr.

In some embodiments, the cobalt-ruthenium layer 224 may be formed via a plasma assisted deposition process, such as a plasma enhanced chemical vapor deposition process, or a thermal chemical vapor deposition process. In some embodiments, for example, the substrate 200 may be exposed to the cobalt precursor and the ruthenium precursor in a plasma state. The plasma may be formed by coupling sufficient energy, for example radio frequency (RF) energy from a power source to ignite the cobalt and ruthenium precursors to form the plasma. In some embodiments, the power source may illustratively provide about 400 watts, of power at a suitable frequency, such as about 13.56 MHz. The plasma facilitates a decomposition of the precursors, causing a deposition of material on the substrate 200, to form the cobalt-ruthenium layer 224.

In some embodiments, as shown at 104-106 and illustrated in FIGS. 2A-2E, the cobalt-ruthenium layer 224 may be formed by exposing the substrate 200 sequentially to the cobalt precursor 218 and then to the ruthenium precursor 234. In such embodiments, the composition of the cobalt-ruthenium layer 224 can be adjusted by adjusting the process time the substrate 200 is exposed to each precursor. For example, in some embodiments, as depicted in FIG. 2A, the substrate 200 may be exposed to the cobalt precursor 218 for a first period of time to form a cobalt layer 222 to a suitable thickness on the first surface of the substrate 200 and on the sidewall 210 and bottom surface 208 of the opening 202. As depicted in FIG. 2B, the substrate 200 is subsequently exposed to the ruthenium precursor 234 for a second period of time, subsequent to the first period of time, to form a ruthenium layer 232 atop the cobalt layer 222, to form the cobalt-ruthenium layer 224 depicted in FIG. 2C. The first period of time and second period of time are sufficient to form the cobalt-ruthenium layer 224 to a suitable thickness, for example a thickness of less than about 20 angstroms. In some embodiments, the first period of time is sufficient to form the cobalt layer 222 to a thickness of about 10 angstroms to about 15 angstroms. In some embodiments, the second period of time is sufficient to form the ruthenium layer 232 to a thickness of about 5 angstroms to about 10 angstroms. In some embodiments, the process chamber is purged of cobalt precursor 218 prior to exposing the substrate 200 to the ruthenium precursor 234. In some embodiments, a reactant gas, as described above, may be provided along with at least one of the cobalt precursor 218 or ruthenium precursor 234.

Figure 3B:
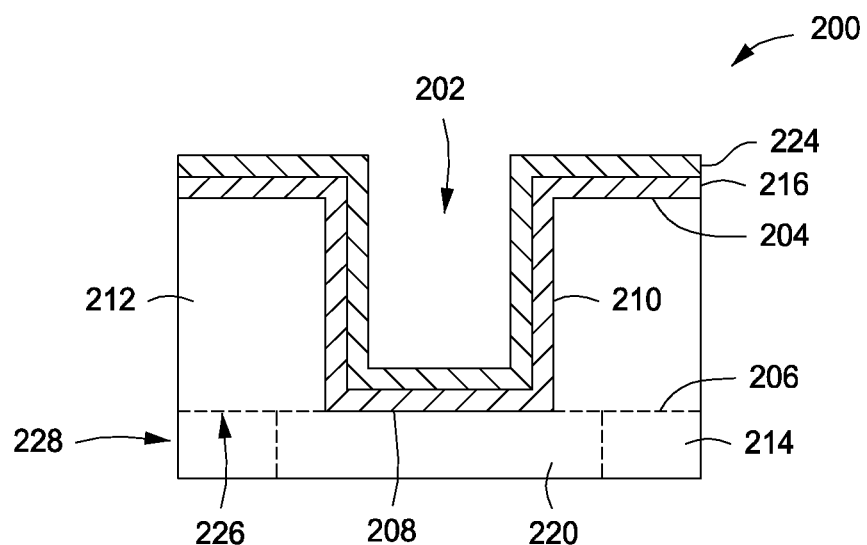

In some embodiments, as shown at 108 and illustrated in FIGS. 3A-3B, the substrate 200 may be exposed simultaneously to the ruthenium precursor 234 and the cobalt precursor 218 to deposit a cobalt-ruthenium layer 224 to a suitable thickness, such as the thickness range recited above. In embodiments where the substrate is simultaneously exposed to the cobalt precursor 218 and the ruthenium precursor 234, the composition of the cobalt-ruthenium layer 224 can be adjusted by adjusting the flow ratio of the precursors. For example, in some embodiments, the cobalt-ruthenium layer 224 may comprise less than about 50 percent ruthenium, with the balance being cobalt. In some embodiments, the ratio of cobalt precursor 218 to ruthenium precursor 234 provided to the processing chamber is about 2:1 to about 4:1.

In some embodiments, the cobalt-ruthenium layer 224 may be a single layer having a uniform or non-uniform composition through a thickness of the cobalt-ruthenium layer 224. For example, in some embodiments, the cobalt-ruthenium layer 224 may comprise a cobalt layer material and a ruthenium layer material, wherein the ruthenium layer material is deposited throughout the thickness of the cobalt-ruthenium layer 224.

In some embodiments, the cobalt-ruthenium layer 224 may have a graded concentration of the cobalt layer and ruthenium layer materials between the interface and the opposing surface of the cobalt-ruthenium layer 224. For example, the cobalt layer material may decrease in concentration from the interface to the opposing surface of the cobalt-ruthenium layer 224 and the ruthenium layer material may increase in concentration from the interface to the opposing surface of the cobalt-ruthenium layer.

In some embodiments, to achieve a graded concentration of the cobalt-ruthenium layer 224 during the co-flow step above, a ratio of the cobalt precursor to the ruthenium precursor may be adjusted during the deposition process. For example, the ratio may be decreased in steps, for example, wherein each step comprises tuning the ratio at a suitable value and flowing at that value for a portion of the deposition period. Alternatively, the ratio may be decreased continuously between the beginning and the end of the deposition period. For example, upon or after beginning the flow of the cobalt precursor and the ruthenium precursor, the flow of the cobalt precursor may be reduced until the flow is stopped. In addition, the flow of the ruthenium precursor may be kept constant or may be increased during the deposition period.

The inventors have observed that, in some embodiments, a barrier layer, deposited using for example a physical vapor deposition process, may not form uniformly on the sidewalls of the opening. As a result, the underlying materials, such as first dielectric layer 212, which may be an oxide layer, may be exposed. The nucleation delay of a cobalt-ruthenium layer grown directly on an oxide layer is greater than the delay of a cobalt-ruthenium layer grown on the barrier layer, resulting in non-uniform growth of the cobalt-ruthenium layer. The inventors have observed that prior to forming the cobalt-ruthenium layer, exposing the substrate 200 to a process gas comprising a cobalt precursor and an inert gas, such as argon or xenon, for a period of time at pressure of about 5 Torr to about 20 Torr forms a cobalt seed layer atop the barrier layer and fills in any gaps in the barrier layer. The cobalt seed layer allows for the uniform growth of the subsequent cobalt-ruthenium layer.

Next at 110, and as depicted in FIG. 2D, following formation of the cobalt-ruthenium layer 224, a conductive material may be deposited on the cobalt-ruthenium layer 224. For example, the conductive material may be deposited on the upper surface of the substrate, as well as the sidewalls 210 and the bottom surface 208 of the feature, to form a conductive layer 230. In some embodiments, the conductive material may be deposited by a physical vapor deposition process. Due to the selectivity of the physical vapor deposition process, the conductive layer 230 may be thicker in regions disposed on the upper surface of the substrate 200 as compared to one or more regions within the opening 202 (e.g., on the sidewalls 210, the bottom surface 208, or both). The conductive material may include metals, metal alloys, or the like, such as one or more of copper (Cu), aluminum (Al), tungsten (W), or the like. In some embodiments, the conductive material is copper.

Figure 2E:
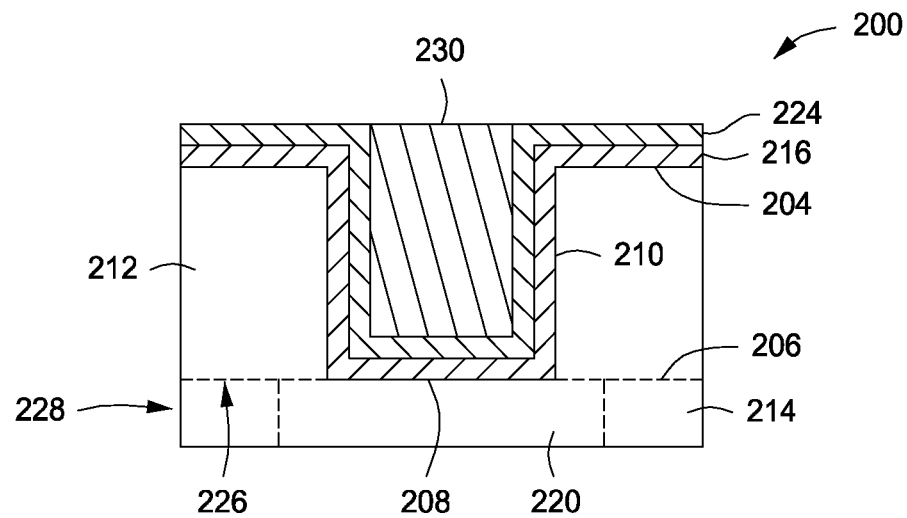

Next at 112, and as depicted in FIG. 2E, the conductive layer 230 may be heated, or annealed, to draw the deposited material into the opening 202 (for example, via capillary action). The heating process may be performed at a temperature ranging from about 150 to about 400 degrees Celsius. The cobalt-ruthenium layer advantageously allows for the conductive material to re-flow into, and fill, the opening without forming a void in the opening. Upon completion of the heating process, the bottom surface 208 of the opening 202 may be covered with deposited material. In some embodiments, the process of depositing the conductive material and annealing the deposited conductive material may be repeated to fill the opening 202. Alternatively, after filling a portion of the opening 202 is filled as described above, the remainder of the opening 202 may be filled using an electrochemical deposition process. Further, when the opening 202 has been filled by the conductive material, the opening 202 may be filled above the level of the upper surface of the substrate and/or deposited material, for example from the conductive layer 230, may remain on the upper surface of the substrate 200. Accordingly, techniques, such as wet clean in an acidic solution, chemical or electrochemical mechanical polishing, or the like may be used to remove excess deposited material from the upper surface, such the opening 202 is filled with the deposited conductive material up to about an equivalent level with the upper surface, as depicted in FIG. 2E.

Figure 4:
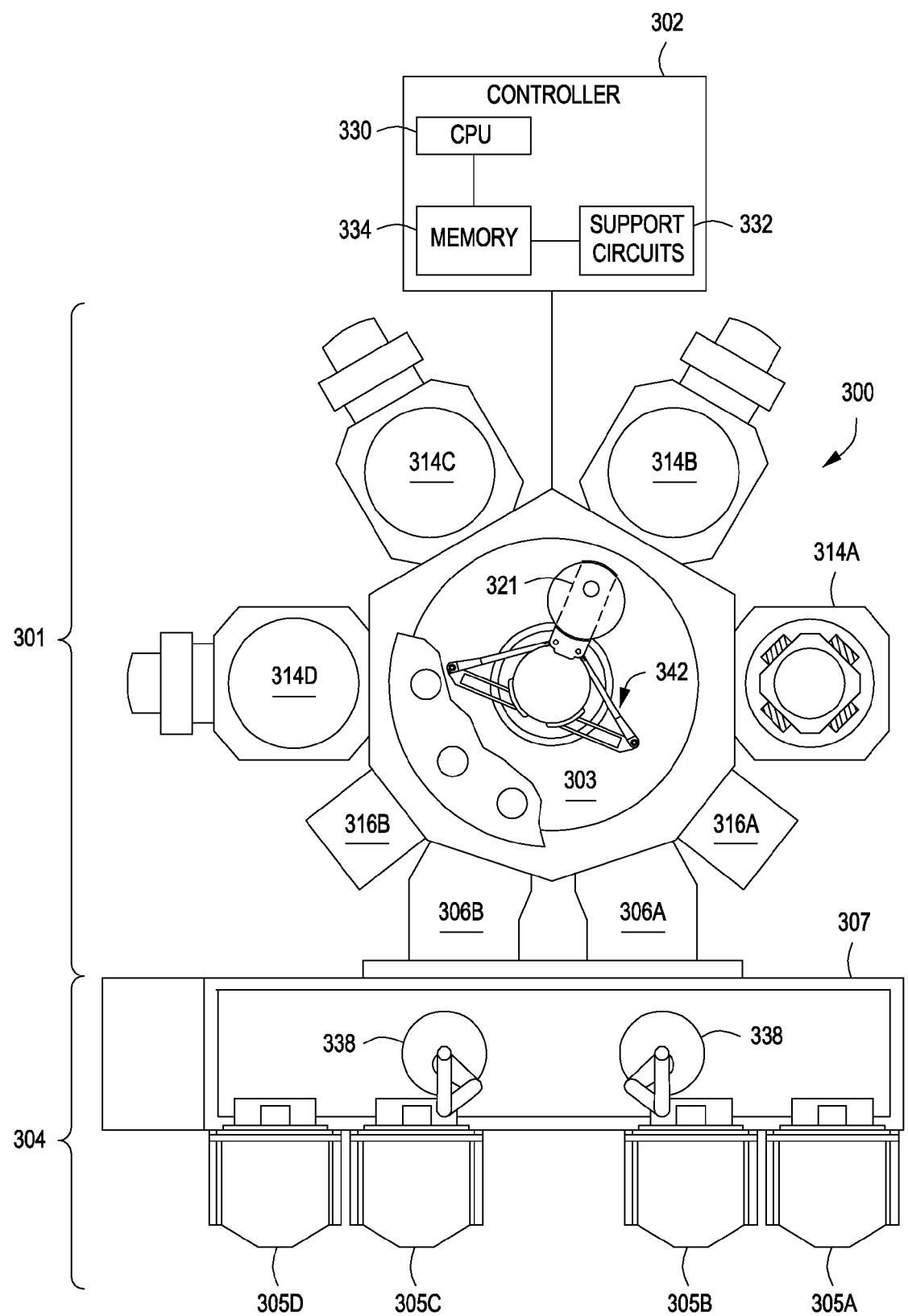
FIG. 4 depicts a cluster tool suitable to perform methods for processing a substrate in accordance with some embodiments of the present disclosure.

The methods described herein may be performed in individual process chambers that may be provided in a standalone configuration or as part of a cluster tool, for example, an integrated tool 300 (i.e., cluster tool) described below with respect to FIG. 4. Examples of the integrated tool 300 include the CENTURA® and ENDURA® integrated tools, available from Applied Materials, Inc., of Santa Clara, Calif. However, the methods described herein may be practiced using other cluster tools having suitable process chambers coupled thereto, or in other suitable process chambers. For example, in some embodiments the inventive methods discussed above may advantageously be performed in an integrated tool such that there are limited or no vacuum breaks between processing steps. For example, reduced vacuum breaks may limit or prevent contamination of the seed layer or other portions of the substrate.

The integrated tool 300 includes a vacuum-tight processing platform 301, a factory interface 304, and a system controller 302. The processing platform 301 comprises multiple processing chambers, such as 314A, 314B, 314C, and 314D operatively coupled to a vacuum substrate transfer chamber (transfer chamber 303). The factory interface 304 is operatively coupled to the transfer chamber 303 by one or more load lock chambers (two load lock chambers, such as 306A and 306B shown in FIG. 4).

In some embodiments, the factory interface 304 comprises at least one docking station 307, at least one factory interface robot 338 to facilitate the transfer of the semiconductor substrates. The docking station 307 is configured to accept one or more front opening unified pod (FOUP). Four FOUPS, such as 305A, 305B, 305C, and 305D are shown in the embodiment of FIG. 4. The factory interface robot 338 is configured to transfer the substrates from the factory interface 304 to the processing platform 301 through the load lock chambers, such as 306A and 306B. Each of the load lock chambers 306A and 306B have a first port coupled to the factory interface 304 and a second port coupled to the transfer chamber 303. The load lock chamber 306A and 306B are coupled to a pressure control system (not shown) which pumps down and vents the load lock chambers 306A and 306B to facilitate passing the substrates between the vacuum environment of the transfer chamber 303 and the substantially ambient (e.g., atmospheric) environment of the factory interface 304. The transfer chamber 303 has a vacuum robot 342 disposed in the transfer chamber 303. The vacuum robot 342 is capable of transferring substrates 321 between the load lock chamber 306A and 306B and the processing chambers 314A, 314B, 314C, and 314D.

In some embodiments, the processing chambers 314A, 314B, 314C, and 314D, are coupled to the transfer chamber 303. The processing chambers 314A, 314B, 314C, and 314D comprise at least a chemical vapor deposition (CVD) chamber, and optionally, an annealing chamber. Additional chambers may also be provided such as additional CVD chambers and/or annealing chambers, a physical vapor deposition (PVD) chamber, or the like. CVD and annealing chambers may include any chambers suitable to perform all or portions of the methods described herein, as discussed above.

In some embodiments, one or more optional service chambers (shown as 316A and 316B) may be coupled to the transfer chamber 303. The service chambers 316A and 316B may be configured to perform other substrate processes, such as degassing, orientation, substrate metrology, cool down and the like.

The system controller 302 controls the operation of the tool 300 using a direct control of the process chambers 314A, 314B, 314C, and 314D or alternatively, by controlling the computers (or controllers) associated with the process chambers 314A, 314B, 314C, and 314D and the tool 300. In operation, the system controller 302 enables data collection and feedback from the respective chambers and systems to optimize performance of the tool 300. The system controller 302 generally includes a Central Processing Unit (CPU) 330, a memory 334, and a support circuit 332. The CPU 330 may be one of any form of a general purpose computer processor that can be used in an industrial setting. The support circuit 332 is conventionally coupled to the CPU 330 and may comprise a cache, clock circuits, input/output subsystems, power supplies, and the like. Software routines, such as a method as described above may be stored in the memory 334 and, when executed by the CPU 330, transform the CPU 330 into a specific purpose computer (system controller) 302. The software routines may also be stored and/or executed by a second controller (not shown) that is located remotely from the tool 300.

While the foregoing is directed to embodiments of the present disclosure, other and further embodiments of the disclosure may be devised without departing from the basic scope thereof.

The invention claimed is:

1. A method of forming a cobalt-ruthenium layer on a substrate disposed in a process chamber, comprising:
   simultaneously exposing a substrate, having an opening formed in a first surface of the substrate to a cobalt precursor and to a ruthenium precursor to form a cobalt-ruthenium layer on the first surface of the substrate and on a sidewall and a bottom surface of the opening, wherein a ratio of the cobalt precursor to the ruthenium precursor is about 2:1 to about 4:1;
   depositing a conductive layer atop the cobalt-ruthenium layer; and
   annealing the substrate to fill the opening by drawing the conductive layer toward the bottom surface of the opening.

2. The method of claim 1, wherein the opening has a height to width aspect ratio of at least about 4:1.

3. The method of claim 1, wherein the cobalt-ruthenium layer has a thickness of less than about 20 angstroms.

4. The method of claim 1, wherein a flow rate of the cobalt precursor is about 750 sccm to about 1000 sccm.

5. The method of claim 1, wherein a flow rate of the ruthenium precursor is about 500 sccm to about 1050 sccm.

6. The method of claim 1, further comprising exposing the substrate to a hydrogen ($H_2$) gas along with the cobalt precursor and the ruthenium precursor.

7. The method of claim 1, further comprising heating the substrate prior to depositing the cobalt-ruthenium layer.

8. The method of claim 1, further comprising maintaining a pressure in the process chamber of about 15 Torr to about 20 Torr during deposition of the cobalt-ruthenium layer.

9. The method of claim 1, wherein the cobalt precursor is one or more of cobalt carbonyl complexes, cobalt amidinate compounds, cobaltocene compounds, cobalt dienyl complexes, cobalt nitrosyl complexes, dicobalt hexacarbonyl acetyl compounds, cyclopentadienyl cobalt bis(carbonyl) ($CpCo(CO)_2$), tricarbonyl allyl cobalt (($CO)_3Co(CH_2CH=CH_2)$), or derivatives thereof, complexes thereof, or combinations thereof.

10. The method of claim 1, wherein the ruthenium precursor is one or more of methyl-cyclohexadine ruthenium tricarbonylcyclohexadine, ruthenium tricarbonyl, butadiene ruthenium tricarbonyl, dimethyl butadiene ruthenium tricarbonyl, or modified dines with $Ru(CO)_3$.

11. The method of claim 1, further comprising:
providing the cobalt precursor to the process chamber at a pressure of about 5 Torr to about 20 Torr to form a cobalt seed layer on the first surface of the substrate and on the sidewall and bottom surface of the opening prior to forming the cobalt-ruthenium layer.

\* \* \* \* \*